US008772866B2

(12) United States Patent
Hong

(10) Patent No.: US 8,772,866 B2

(45) Date of Patent: Jul. 8, 2014

(54) SEMICONDUCTOR DEVICE AND METHOD FOR FABRICATING THE SAME

(75) Inventor: Sung Pyo Hong, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 472 days.

(21) Appl. No.: 12/650,436

(22) Filed: Dec. 30, 2009

(65) Prior Publication Data

US 2011/0024830 A1 Feb. 3, 2011

(30) Foreign Application Priority Data

Jul. 28, 2009 (KR) ........................ 10-2009-0069072

(51) Int. Cl.
*H01L 29/66* (2006.01)

(52) U.S. Cl.
USPC ................... 257/332; 257/330; 257/E29.262; 257/E21.294; 438/589

(58) Field of Classification Search
USPC .................. 257/330, 332, E29.262, E21.177, 257/E21.294; 438/586, 589
See application file for complete search history.

(56) References Cited

U.S. PATENT DOCUMENTS

| | | | | |
|---|---|---|---|---|
| 6,770,535 | B2 * | 8/2004 | Yamada et al. | 438/270 |
| 2002/0045332 | A1 * | 4/2002 | Jang et al. | 438/585 |
| 2007/0148937 | A1 * | 6/2007 | Yagishita et al. | 438/585 |
| 2008/0026537 | A1 * | 1/2008 | Chung | 438/386 |
| 2008/0160737 | A1 * | 7/2008 | Oh et al. | 438/585 |
| 2008/0166864 | A1 * | 7/2008 | Oshima | 438/589 |

FOREIGN PATENT DOCUMENTS

| | | | |
|---|---|---|---|
| KR | 1020060093165 | A | 8/2006 |
| KR | 1020060104033 | A | 10/2006 |
| KR | 100849192 | B1 | 7/2008 |

* cited by examiner

*Primary Examiner* — Colleen Matthews
*Assistant Examiner* — Colleen E Snow

(57) ABSTRACT

A semiconductor device comprises a buried gate formed by being buried under a surface of a semiconductor substrate, a dummy gate formed on the buried gate, and a landing plug formed on a junction region of the semiconductor substrate being adjacent to the dummy gate.

17 Claims, 7 Drawing Sheets

SEMICONDUCTOR DEVICE AND METHOD FOR FABRICATING THE SAME

CROSS-REFERENCE TO RELATED APPLICATION

The priority based on Korean patent application No. 10-2009-0069072 filed on 28 Jul. 2009, the disclosure of which is hereby incorporated in its entirety by reference, is claimed.

BACKGROUND OF THE INVENTION

The present invention relates to a semiconductor device, and more specifically, to a semiconductor device including a buried gate and a fabricating method of the same.

A typical semiconductor memory device is a dynamic random access memory (DRAM). A DRAM device includes a plurality of unit cells each of which includes a capacitor and a transistor. The capacitor is used for temporarily storing data and the transistor is used for transferring the data between a bit line and the capacitor in response to a control signal (word line). The transistor has three regions, i.e., a gate, a source and a drain. According to a control signal inputted to the gate, an electric charge moves between the source and the drain. The movement of the electric charge between the source and the drain is performed through a channel region. The properties of the semiconductor are used for forming this channel.

In the case of fabricating a conventional transistor on a semiconductor substrate, the gate is formed on the semiconductor substrate and the source and the drain are formed by doping both sides of the gate with impurities. In this case, under the gate, between the source and the drain, there is the channel region of the transistor. Such a transistor having a horizontal channel region occupies a certain area of the semiconductor substrate. In case of a complex semiconductor memory device, it is difficult to reduce a whole size due to a plurality of transistors included in the semiconductor memory device.

If the size of the semiconductor memory device is reduced, the number of semiconductor memory devices produced per wafer can be increased and thus productivity can be improved. For reducing the size of the semiconductor memory device, various methods have been proposed. One of these is to use a recess gate instead of a conventional planar gate having the horizontal channel region. That is, a recess is formed in the semiconductor substrate and the gate is formed in the recess so that the channel region is formed along a multi-plane surface of the recess. For more improvement from the recess gate structure, a buried gate formed by burying an entire gate within the recess is researched.

BRIEF SUMMARY OF THE INVENTION

Embodiments of the present invention provide a semiconductor memory device and a fabricating method of the same capable of preventing a self aligning contact (SAC) fail and a gate induced drain leakage (GIDL) phenomenon and reducing a contact resistance by forming a dummy gate on a buried gate for the dummy gate to act as an etching barrier when a landing plug contact hole is formed.

In accordance with one embodiment of the present invention, there is provided a semiconductor device comprising a buried gate formed by being buried under a surface of a semiconductor substrate; a dummy gate formed on the buried gate; and a landing plug formed on a junction region of the semiconductor substrate being adjacent to the dummy gate.

Preferably, the dummy gate includes a nitride film.

Preferably, the buried gate includes a recess formed on a gate region of the semiconductor substrate with a predetermined depth; a gate oxide film formed on a surface of the recess; and a gate conductive layer formed within the recess.

Preferably, the gate conductive layer includes TiN and W.

Preferably, the semiconductor device further comprises a sealing nitride film formed on a surface of the gate conductive layer inside of the recess; and a capping oxide film formed on the sealing nitride film inside of the recess.

Preferably, the semiconductor device further comprises an interlayer dielectric formed on the surface of the semiconductor substrate including the dummy gate.

Preferably, the semiconductor device further comprises a bit line contact plug and a storage node contact plug formed on the landing plug.

In accordance with another embodiment of the present invention, there is provided a manufacturing method of a semiconductor device, comprising forming a buried gate under a surface of a semiconductor substrate by burying the buried gate; forming a dummy gate on the buried gate; and forming a landing plug on a junction region of the semiconductor substrate, wherein the landing plug is adjacent to the dummy gate.

Preferably, the dummy gate is formed with a nitride film.

Preferably, the forming the dummy gate includes depositing a dummy gate material on the semiconductor substrate; forming a photoresist pattern on the dummy gate material; and etching the dummy gate material using the photoresist pattern as a mask.

Preferably, the forming the buried gate includes forming a recess on a gate region of the semiconductor substrate with a predetermined depth; forming a gate oxide film on a surface of the recess; and forming a gate conductive layer within the recess.

Preferably, the gate conductive layer is formed including TiN and W.

Preferably, the manufacturing method further comprises forming a sealing nitride film on a surface of the gate conductive layer inside of the recess; and forming a capping oxide film on the sealing nitride film inside of the recess.

Preferably, the manufacturing method further comprises forming an interlayer dielectric on the surface of the semiconductor substrate including the dummy gate after the forming the dummy gate.

Preferably, the manufacturing method further comprises forming a bit line contact plug and a storage node contact plug on the landing plug.

In accordance with still another embodiment of the present invention, there is provided a manufacturing method of a semiconductor device comprising forming a recess on a gate region of a semiconductor substrate with a predetermined depth; forming a gate oxide film on a surface of the recess; forming a buried gate by forming a gate conductive layer within the recess; depositing a dummy gate material on the semiconductor substrate; forming a photoresist pattern on the dummy gate material; forming a dummy gate by etching the dummy gate material using the photoresist pattern as a mask; forming an interlayer dielectric on a surface of the semiconductor substrate including the dummy gate; and forming a landing plug by etching the interlayer dielectric and burying a landing plug material on a junction region of the semiconductor substrate adjacent to the dummy gate.

Preferably, the manufacturing method further comprises forming a bit line contact plug and a storage node contact plug on the landing plug.

Preferably, the manufacturing method further comprising forming a sealing nitride film on a surface of the gate conductive layer inside of the recess; and forming a capping oxide film on the sealing nitride film inside of the recess.

Preferably, the dummy gate material is formed with a nitride film.

Preferably, the gate conductive layer is formed including TiN and W.

DESCRIPTION OF EMBODIMENTS

Hereinafter, a contact plug for a buried gate of a semiconductor device and a manufacturing method for the same in accordance with an embodiment of the present invention are described in detail with reference to the accompanying drawings.

Figure 1:
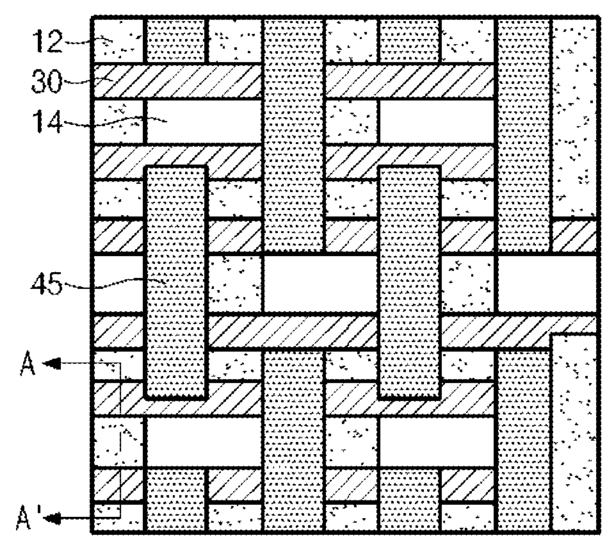
FIG. 1 is a plan view illustrating a semiconductor device in accordance with the present invention.

FIG. 1 is a plan view illustrating a semiconductor device in accordance with the present invention. Referring to FIG. 1, a plurality of active regions 12 is formed in a vertical direction on a semiconductor substrate 10, and a device isolation film 14 for defining the active region 12 is formed on the semiconductor substrate 10.

A plurality of buried gates 20 (refer to FIG. 2A) is formed in a horizontal direction across the plurality of active regions 12. This buried gate 20 is formed such that two buried gates 20 cross one active region 12. On an upper part of the buried gate 20, a dummy gate 30 is formed at the same position as the buried gate 20 in a plan view. Although the dummy gate 30 does not act as an actual gate, it acts as an etching barrier being positioned on the upper part of the buried gate 20 when a landing plug contact hole 44 (refer to FIG. 2H) is etched. Since an etching selection ratio of the dummy gate 30 is low in comparison with an inter-layered insulating film 42 (refer to FIG. 2G), the dummy gate 30 may be formed with material which is not easily etched such as nitride.

Meanwhile, on an upper part of the semiconductor substrate 10 where the dummy gate 30 has been formed, the inter-layered insulating film 42 is formed and a landing plug mask 45 for opening the landing plug contact hole 44 region where a landing plug is to be formed among the inter-layered insulating film 42 is formed.

In this way, by forming the dummy gate 30 on the upper part of the semiconductor substrate 10 where the buried gate 20 is formed, a bridge phenomenon can be prevented from occurring between landing plugs 46 (refer to FIG. 3A) or a contact hole of the landing plug 46 is not completely opened when an etching process is performed to the landing plug contact hole 44. Also, since a contact area of the landing plug 46 is increased, a resistance of the landing plug 46 can be reduced.

FIGS. 2A to 2I are cross-sectional views sequentially illustrating a fabricating method of the semiconductor device in accordance with the present invention and sectioning the semiconductor device along the line A-A' shown in FIG. 1. Referring to FIGS. 2A to 2I, the fabricating method of the semiconductor device in accordance with the present invention is sequentially described as follows.

Figure 2A:
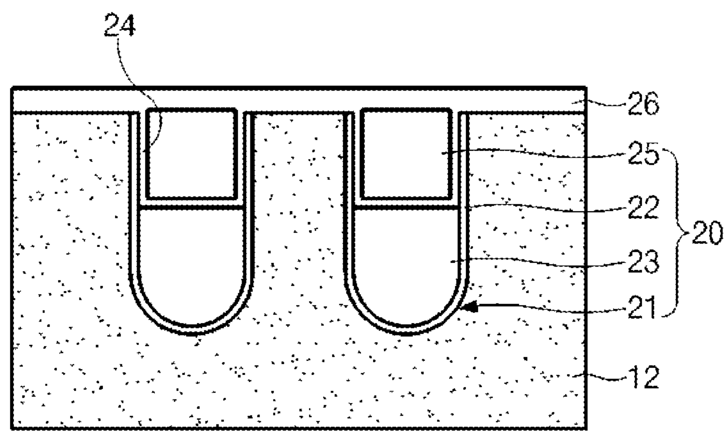
FIGS. 2A to 2I are cross-sectional views sequentially illustrating a fabricating method of the semiconductor device in accordance with the present invention.

First, referring to FIG. 2A, two buried gates 20 are formed in one active region 12 of the semiconductor substrate 10. Regarding a process for forming the buried gate 20, a recess 21 is formed on the substrate 10 with a predetermined depth, and a gate oxide film 22 is deposited on a surface of the recess 21 in order to protect the active region 12 which is silicon material. Then, a gate conductive layer 23 is buried on a surface of the gate oxide film 22 within the recess 21. The gate conductive layer 23 may include TiN and W (tungsten).

Meanwhile, a sealing insulating layer 24 is formed on a surface of the recess 21 including an upper surface of the gate conductive layer 23. Herein, the sealing insulating layer 24 is a nitride layer. Thereafter, in the remaining space of the recess 21 where the sealing insulating layer 24 has been formed, a capping oxide film 25 is formed. The capping oxide film 25 is a silicon on dielectric (SOD) material.

Thereafter, an insulating film 26 is formed on a front side of the semiconductor substrate 10 including the recess 21 where the capping oxide film 25 has been buried. The insulating film 26 is for protecting a surface of the capping oxide film 25 or the like. The insulating film 26 may include a nitride film or an oxide film.

Figure 2B:
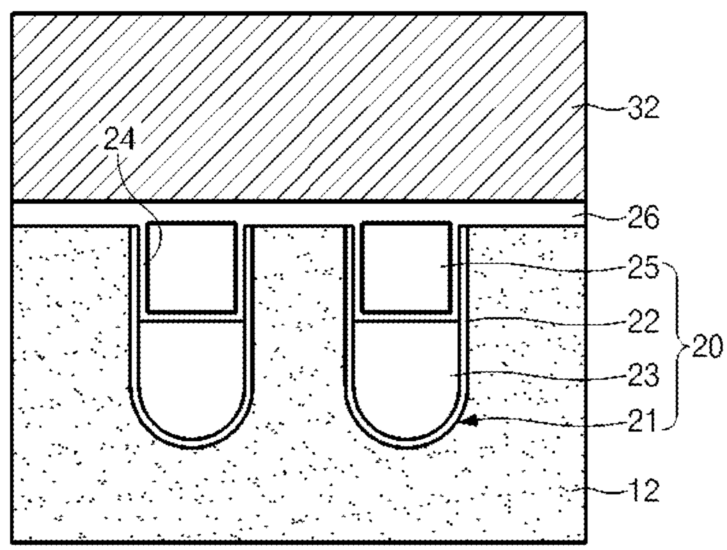

Next, as shown in FIG. 2B, a nitride film 32 is deposited on the upper part of the semiconductor substrate 10 where the insulating film 26 has been formed. A structure of the nitride film 32 becomes the dummy gate 32 if the nitride film 32 is etched as a predetermined pattern. Material of the nitride film 32 is not limited to the nitride. Material which has a lower etching selection ratio than the interlayer dielectric 42 (ILD, refer to FIG. 2F) and thus is not easily etched is satisfactory.

Figure 2C:
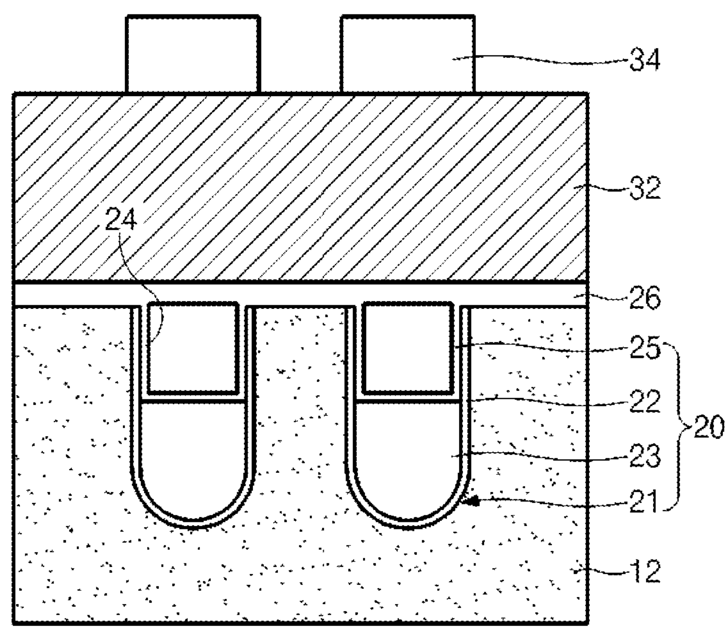
Figure 2D:
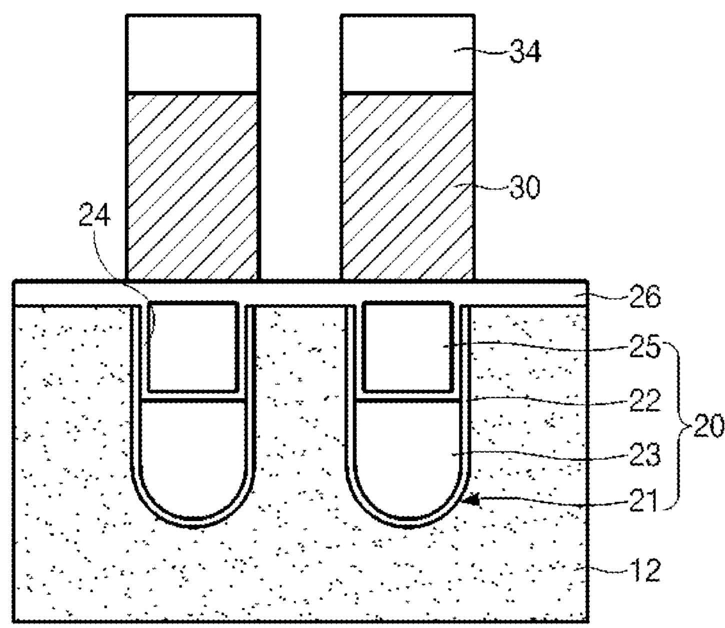
Figure 2E:
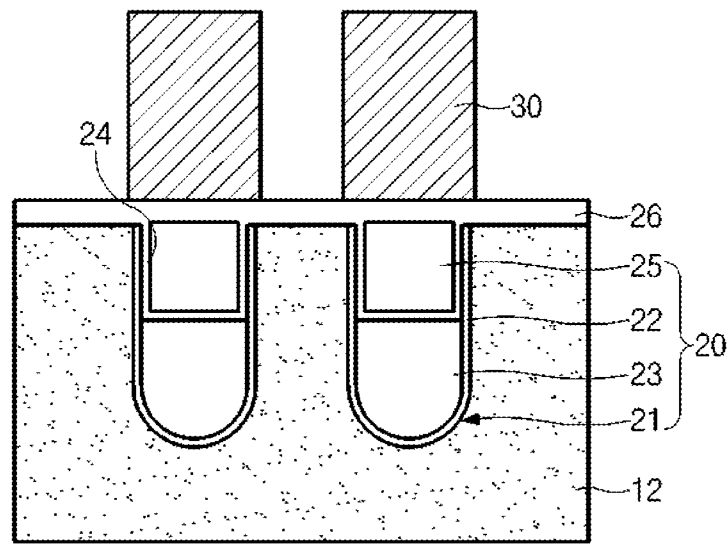

Thereafter, referring to FIG. 2C, a photoresist pattern 34 is formed on the nitride film 32. As shown in FIG. 2D, the dummy gate 30 is formed by etching the nitride film 32 using the photoresist pattern 34 as a mask. Then, the photoresist pattern 34 is removed as shown in FIG. 2E. Herein, the photoresist pattern 34 and the dummy gate 30 are formed at the same position as the buried gate 20, i.e., the horizontal direction indicated by '30 ' in the plan view shown in FIG. 1. As a result, the dummy gate 30 is formed only on the buried gate 20. And, the dummy gate 30 is such formed that a junction region including a source and a drain on right and left sides of the buried gate 20 can be opened.

Figure 2F:
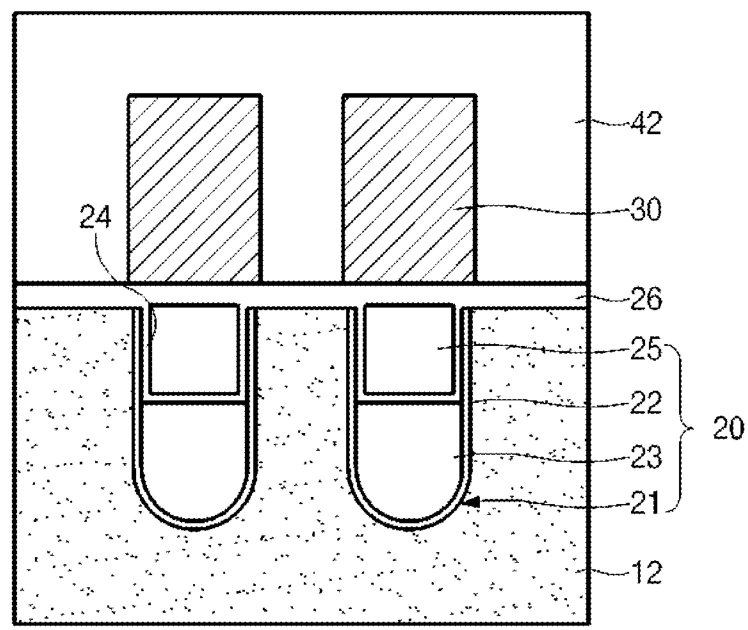
Figure 2G:
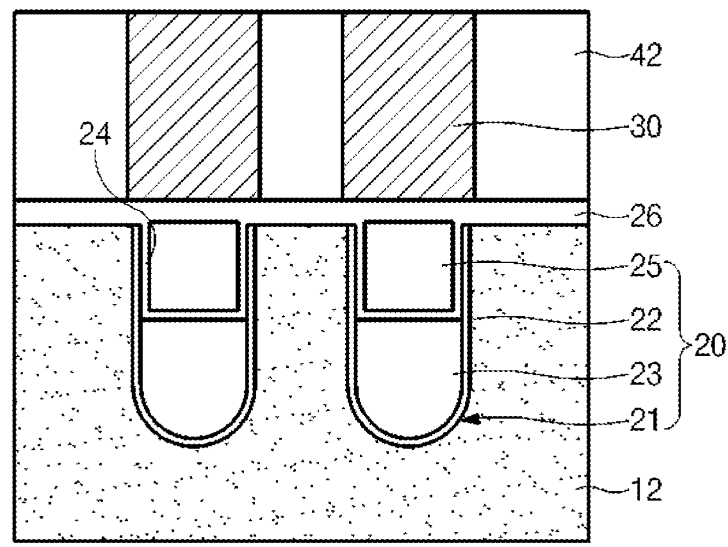
Figure 2H:
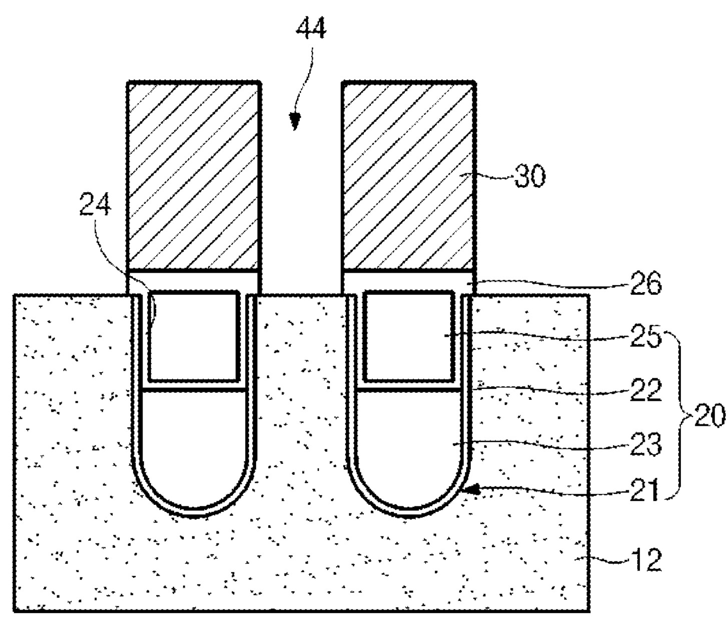

Next, as shown in FIG. 2F, the interlayer dielectric 42 is formed on the front side of the semiconductor substrate 10 where the dummy gate 30 has been formed. Thereafter, as shown in FIG. 2G, a part of the interlayer dielectric 42 is etched using a chemical mechanical polishing (CMP) or an etch-back process so that the dummy gate 30 is exposed.

Thereafter, by forming the landing plug mask 45 (refer to FIG. 1) on the interlayer dielectric 42 and the dummy gate 30, a space where the landing plug contact hole 44 is to be formed is opened. Then, the landing plug contact hole 44 is formed by etching the interlayer dielectric 42 using the landing plug mask 45 and the dummy gate 30 as etching masks. The interlayer dielectric is etched using a dry etch step.

All the junction region of the semiconductor substrate 10 is opened due to the formation of the landing plug contact hole 44, and the dummy gate 30 acts as the etching barrier when the landing plug contact hole 44 is etched. Therefore, a bridge between landing plugs 46 (refer to FIG. 2I) or the landing plug hole contact hole 44 is not completely opened can be prevented.

Figure 2I:
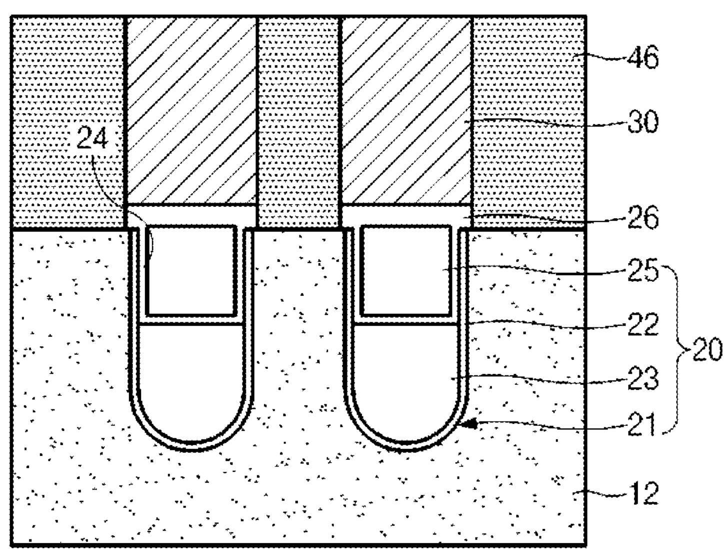

Finally, as shown in FIG. 2I, a landing plug material for filling the landing plug contact hole 44 is deposited, and the landing plug 46 is formed by removing an upper part of the landing plug material using the CMP or the etch-back process for the dummy gate 30 to be exposed.

Thereafter, although not shown, a bit line contact plug is formed on the landing plug 46. Then, a bit line is formed on the bit line contact plug. And, a storage node contact plug is formed on another landing plug 46 and a storage node is formed on the storage node contact plug. Thereafter, by forming a metal wire on the above-described structure, the semiconductor device is completed.

Figure 3A:
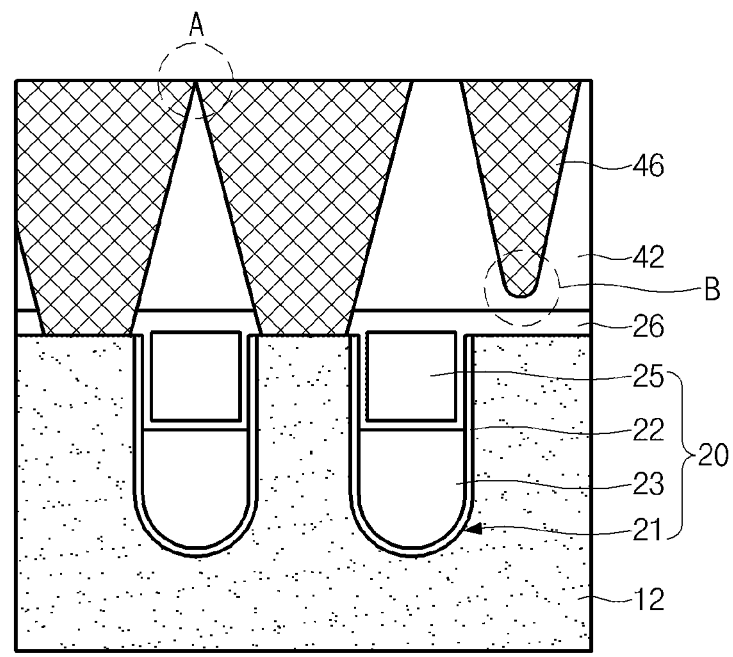
FIGS. 3A and 3B are diagrams illustrating a distinctive structure of the semiconductor device in accordance with the present invention.
Figure 3B:
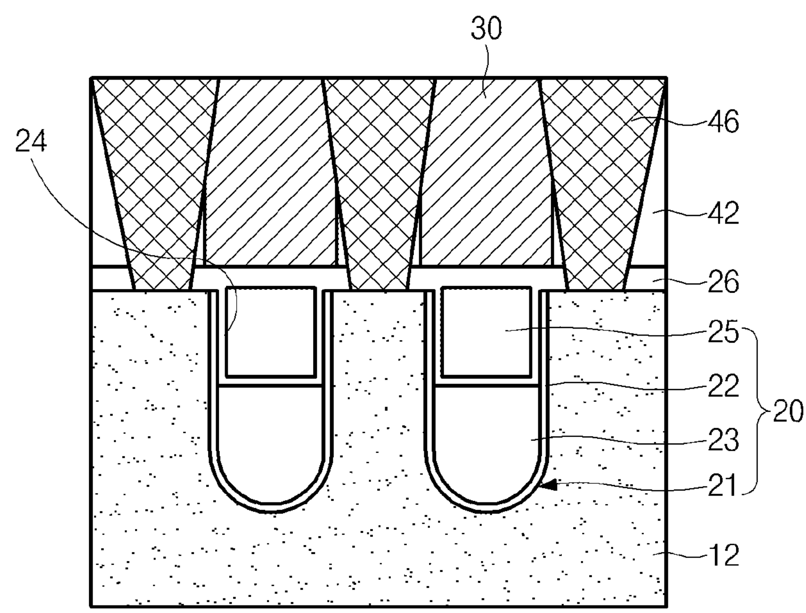

Meanwhile, FIGS. 3A and 3B are diagrams illustrating a semiconductor device in accordance with the present invention. As shown in FIG. 3A, in the case where a structure for acting as an etching barrier such as the dummy gate 30 on the buried gate 20 does not exist, only the interlayer dielectric 42 exists on the buried gate 20. Herein, in the case of forming the landing plug 46 by etching only the interlayer dielectric 42, upper parts of the landing plugs 46 may be bridged to each other when the etching is excessively performed (see 'A' in FIG. 3*a*). On the other hand, all the junction region of the semiconductor device 10 may not be opened when the etching is insufficiently performed (see 'B' in FIG. 3*a*).

However, as shown in FIG. 3B, in the case where there is a structure for acting as the etching barrier such as the dummy gate 30 whose etching selection ratio is low on the buried gate 20, even though the interlayer dielectric 42 is excessively etched, the neighboring landing plugs 46 can be prevented from being bridged to each other since the dummy gate 30 acts as the etching barrier. As a result, it is needless to worry that the junction region of the semiconductor substrate 10 is not opened.

Accordingly, an SAC fail which occurs when the landing plug contact is formed can be prevented, and a gate induced drain leakage (GIDL) phenomenon can also be prevented. Further, by increasing the contact area of the landing plug 46, the contact resistance of the landing plug 46 can be reduced.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
- a buried gate provided entirely within a recess of a semiconductor substrate;
- a sealing nitride film formed over the buried gate and at least within the recess;
- a capping oxide film formed over the sealing nitride film and at least within the recess;
- a dummy gate formed over the capping oxide film; and
- a landing plug formed over a junction region of the semiconductor substrate provided adjacent to the dummy gate.

2. The semiconductor device according to claim 1, wherein the dummy gate includes a nitride film.

3. The semiconductor device according to claim 1, wherein the buried gate includes:
- a gate dielectric film formed over a surface of the recess; and
- a gate conductive layer formed within the recess over the gate dielectric film,
- wherein the dummy gate includes nitride.

4. The semiconductor device according to claim 3, wherein the gate conductive layer includes TiN and W.

5. The semiconductor device according to claim 1, further comprising an interlayer dielectric formed over a surface of the semiconductor substrate including the dummy gate, wherein the dummy gate has different etch characteristics than the interlayer dielectric.

6. The semiconductor device according to claim 1, further comprising a bit line contact plug and a storage node contact plug formed over the landing plug.

7. A manufacturing method of a semiconductor device, comprising:
- forming first and second buried gates within first and second recesses of a semiconductor substrate, respectively, the first and second buried gates each being provided entirely within the first and second recesses, respectively;
- forming first and second sealing nitride films over the first and second buried gates and at least within the first and second recesses, respectively;
- forming first and second capping oxide films over the first and second sealing nitride films and at least within the first and second recesses, respectively;
- forming first and second dummy gates over the first and second capping oxide films, respectively, the first and second dummy gates defining a landing plug contact area therebetween;
- forming an interlayer dielectric over the first and second dummy gates and the landing plug contact area;
- etching the interlayer dielectric using the first and second dummy gates as etch masks to form a landing plug contact hole that exposes a surface of the semiconductor substrate, the landing plug contact hole corresponding to the landing plug contact area defined by the first and second dummy gates; and
- forming a landing plug within the landing plug contact hole, the landing plug contacting a junction region of the semiconductor substrate.

8. The manufacturing method according to claim 7, further comprising:
- removing the interlayer dielectric at least until the first and second dummy gates are exposed,
- wherein the interlayer dielectric is etched to form the landing plug contact hole after the first and second dummy gates have been exposed.

9. The manufacturing method according to claim 7, wherein the forming the first and second dummy gates include:
- depositing a dummy gate material over the semiconductor substrate;
- forming a photoresist pattern over the dummy gate material; and
- etching the dummy gate material using the photoresist pattern as a mask.

10. The manufacturing method according to claim 7, wherein the forming the first and second buried gates includes:
- forming the recess in the semiconductor substrate;
- forming a gate dielectric film over a surface of the recess; and
- forming a gate conductive layer over the gate dielectric film and within the recess.

11. The manufacturing method according to claim 10, wherein the gate conductive layer includes TiN and W, and the first and second dummy gates include nitride.

12. The manufacturing method according to claim 7, wherein the interlayer dielectric and the first and second dummy gates have different etch characteristics.

13. The manufacturing method according to claim 7, further comprising:

forming a mask pattern over the first and second dummy gates to define the landing plug contact hole, wherein the landing plug contact hole is formed by etching the interlayer dielectric using the mask pattern and the first and second dummy gates as the etch mask.

14. A manufacturing method of a semiconductor device, comprising:

forming a recess in a semiconductor substrate;

coating a gate oxide film over a surface of the recess;

providing a gate conductive layer within the recess to form a buried gate, the buried gate being provided entirely within the recess;

forming a sealing nitride film over a surface of the gate conductive layer and at least within the recess;

forming a capping oxide film over the sealing nitride film and at least within the recess;

depositing a dummy gate material over the semiconductor substrate;

etching the dummy gate material to form a dummy gate over the buried gate;

forming an interlayer dielectric over the semiconductor substrate including the dummy gate;

etching the interlayer dielectric using the dummy gate as an etch mask to form a landing plug contact hole exposing the surface of the semiconductor substrate; and providing a landing plug material within the landing plug contact hole to form a landing plug adjacent to the dummy gate.

15. The manufacturing method according to claim 14, further comprising forming a bit line contact plug and a storage node contact plug over the landing plug.

16. The manufacturing method according to claim 14, wherein the dummy gate material includes nitride.

17. The manufacturing method according to claim 14, wherein the gate conductive layer includes TiN and W.

* * * * *